United States Patent
Nasu et al.

(10) Patent No.: US 6,724,800 B2
(45) Date of Patent: Apr. 20, 2004

(54) WAVELENGTH MONITOR AND LASER MODULE

(75) Inventors: Hideyuki Nasu, Tokyo (JP); Takehiko Nomura, Toyko (JP); Tomohiro Takagi, Tokyo (JP); Mizuki Oike, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 51 days.

(21) Appl. No.: 10/224,607

(22) Filed: Aug. 21, 2002

(65) Prior Publication Data

US 2003/0039279 A1 Feb. 27, 2003

(30) Foreign Application Priority Data

Aug. 22, 2001 (JP) ........................................ 2001-252093
Jan. 31, 2002 (JP) ........................................ 2002-024457

(51) Int. Cl.$^7$ ............................................. H01S 3/08
(52) U.S. Cl. ......................... 372/107; 372/97; 372/98; 372/108
(58) Field of Search ........................ 372/107, 98, 108, 372/97

(56) References Cited

U.S. PATENT DOCUMENTS

2002/0105984 A1 * 8/2002 Yamamoto et al. ........... 372/44
2003/0039279 A1 * 2/2003 Nasu et al. .................... 372/36

FOREIGN PATENT DOCUMENTS

DE 3841045 A1 * 6/1990 ............. H01S/3/05
JP 2000-56185 2/2000

* cited by examiner

*Primary Examiner*—Leon Scott, Jr.
(74) *Attorney, Agent, or Firm*—Oblon, Spivak, McClelland, Maier & Neustadt, P.C.

(57) ABSTRACT

A wavelength monitor capable of obtaining an optical detection signal of high quality is proposed. In the wavelength monitor, a light incident surface of an optical filter is disposed with an inclination relative to the light incident direction. With this arrangement, it is possible to make the route of a reflection light that has been reflected from the light incident surface of the optical filter deviate large from the route of an incident light that has been incident to the optical filter. Consequently, the reflected light is prevented from being incident to a semiconductor laser device or optical detectors.

20 Claims, 14 Drawing Sheets

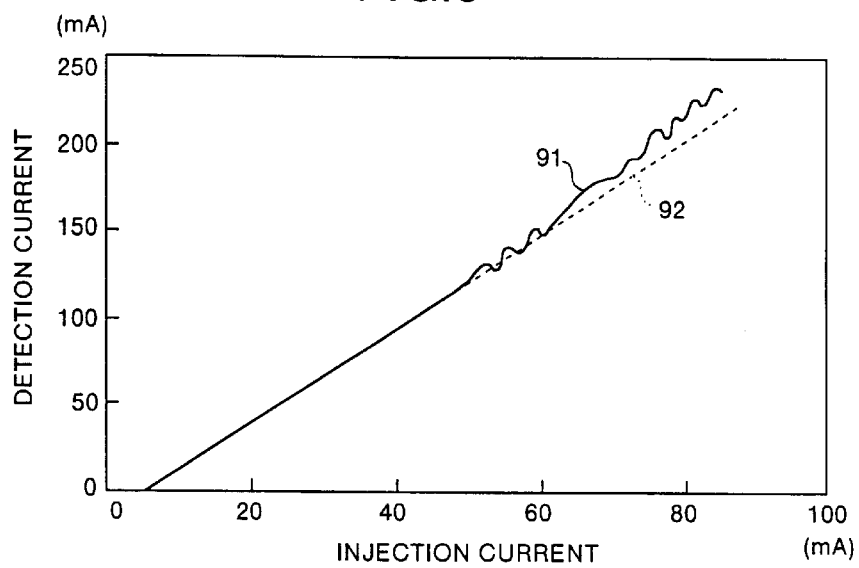

WAVELENGTH MONITOR AND LASER MODULE

BACKGROUND OF THE INVENTION

1) Filed of the Invention

The present invention relates to a semiconductor laser module that is utilized in an optical transmitter. Particularly, the invention relates to a wavelength monitor inside an optical signal transmission module that is utilized in a wavelength division multiplexing (WDM) system, and a laser module with integrated wavelength monitor.

2) Description of the Related Art

A semiconductor laser device can obtain large laser output power when an injection current is increased. In general, the calorific value of the device itself increases in proportion to the injection current. The increase in heat affects the characteristics of semiconductor layers and optical parts that constitute the semiconductor laser device. The increase in heat generates various inconveniences. For example, the wavelength of an actual laser output is deviated from a desired wavelength, and the life of the device is shortened.

Particularly, in the semiconductor laser device that is used in a high-density WDM system, it is necessary to carry out wavelength control precisely. Therefore, it is necessary that the wavelength of an optical signal is stable over a long period of time. For this purpose, there has been developed a technique of providing a wavelength monitoring function inside a laser module that is built in with a semiconductor laser device.

FIG. 15 is a top plan cross-sectional view of a laser module that has been proposed by the applicant of the present invention in U.S. patent application No. 10/032,612 (a first conventional example). In a laser module 200 shown in FIG. 15, the front end of an optical fiber 11 is fixed to a package 201 with a ferrule 12, in order to emit a laser beam generated by a semiconductor laser device 20 into the optical fiber 11.

On the bottom surface of the package 201, there are adjacently disposed a first thermo-module and a second thermo-module not shown that can be heated or cooled based on a control from the outside. A base 30 made of CuW or the like is mounted on the first thermo-module. On this base 30, there are disposed a sub-mount 34 that is mounted with the semiconductor laser device 20 and a thermistor 21 that measures the temperature of the semiconductor laser device 20, a condenser lens 33 that connects a laser beam output from a front end surface of the semiconductor laser device 20 to the optical fiber 11, an optical isolator 32 that interrupts a return light reflected from the optical fiber 11, and a parallel lens 35 that makes parallel a monitoring laser beam that is output from a back end surface of the semiconductor laser device 20. Sections including the base 30, the condensing lens 33, the sub-mount 34, and the parallel lens 35 will be collectively called a laser section.

On the other hand, a base 50 made of CuW or the like is mounted on the second thermo-module. On this base 50, there are disposed a prism 51 that divides a monitoring laser beam that is output from the back end surface of the semiconductor laser device 20, into two directions at a predetermined angle, an optical filter 52 into which one of the lights divided by the prism 51 is incident, and a sub-mount 53. On the front surface (the surface of a laser emission direction) of the sub-mount 53, there are disposed on the same plane a first optical detector 41 that receives the other light divided by the prism 51, and a second optical detector 42 that receives the light that has been transmitted through the optical filter 52. Photodiodes are used for the first optical detector 41 and the second optical detector 42. The prism 51 is constructed of light incident surfaces 51a and 51b mutually formed at a predetermined angle to which the monitoring beam is incident, and a light emission surface 51c from which lights that have been divided within the prism 51 are emitted.

In the vicinity of the portion at which the prism 51 is fixed, there is provided a thermistor 54 that monitors the temperature of the optical filter 52. The base 50 and sections including the various constituent elements provided on the base 50 will be collectively called a wavelength monitor.

Based on the above structure, the laser module 200 controls the temperatures of the first thermo-module and the second thermo-module, thereby to realize a stable laser oscillation. The temperature control carried out by this laser module 200 will be briefly explained below. First, the monitoring laser beam that is output from the back end surface of these miconductor laser device 20 passes through the parallel lens 35, and is divided into two directions by the prism 51.

One of the lights obtained by dividing by the prism 51 is converted into a current by the first optical detector 41, and this current is converted into a voltage by a current-voltage converter not shown. This voltage is used as a reference voltage. The other light obtained by the dividing by the prism 51 passes through the optical filter 52, and is converted into a current by the second optical detector 42, and this current is converted into a voltage by a current-voltage converter not shown. This voltage is used as a signal voltage. The optical filter 52 has characteristics of different transmittances for the wavelengths of the incident light. This optical filter 52 is formed with an etalon, for example. A difference between the signal voltage obtained by passing the light of a desired wavelength through the optical filter 52 and the reference voltage will be called a reference voltage difference. Then, it is possible to know a wavelength deviation by comparing a voltage difference between the actual reference voltage and the signal voltage with the reference voltage difference.

This wavelength deviation is due to the heating of the semiconductor laser device 20. Therefore, in order to correct this deviation, the sub-mount 34 beneath the semiconductor laser device 20 may be cooled. The voltage that shows the wavelength deviation that is obtained based on the above comparison is used as a control voltage for a controller not shown to control the temperature of the first thermo-module disposed beneath the base 30. The first thermo-module is operated as a cooler. With this arrangement, the semiconductor laser device 20 is cooled via the first thermo-module, the base 30, and the sub-mount 34, and is feedback controlled to output the laser beam of a desired wavelength. This will hereinafter be referred to as a wavelength locking. When excessive cooling is obtained based on the feedback control, the first thermo-module operates as a heater.

The characteristic of the optical filter 52 that is formed with etalon changes depending on the temperature. Therefore, it is preferable to keep constant the temperature of the optical filter 52. The controller not shown calculates a difference between a desired temperature and the temperature detected by the thermistor 54, and controls the temperature of the second thermo-module disposed beneath the base 50, by using the voltage corresponding to this difference as a control voltage. With this arrangement, the optical filter 52 is heated or cooled via the second thermo-module and the base 50, and is stabilized at the desired temperature.

FIG. 16 is a top plan cross-sectional view of a laser module which shows a second conventional example. In FIG. 16, sections that are common to those shown in FIG. 15 are attached with identical reference symbols, and explanation of these sections will be omitted. A laser module 210 shown in FIG. 16 is different from the laser module 200 shown in FIG. 15 in only the structure of the wavelength monitor.

Specifically, on a base 50, there are disposed sub-mounts 61 and 62 that are separated from each other so that their main surfaces form a right angle, a half-mirror 71 that transmits a monitoring laser beam output from the back end surface of a semiconductor laser device 20 to a sub-mount 61 and that also reflects the monitoring laser beam to a sub-mount 62, and an optical filter 72 to which the light reflected from the half-mirror 71 is incident. On the front surface (main surface) of the sub-mount 61, there is provided a first optical detector 63 that receives the light that has transmitted through the half-mirror 71. On the front surface (main surface) of the sub-mount 62, there is provided a second optical detector 64 that receives the light that has transmitted through the half-mirror 72. The laser module 210 carries out the temperature control in a similar manner to that of the laser module 200.

However, according to the laser modules that make it possible to carry out the wavelength locking in the first and second conventional examples, a stray light of laser beams occurs in the wavelength monitor. Therefore, it has not been possible to carry out a precise wavelength locking. This problem will be explained below.

FIG. 17 is an explanatory view which explains the problems of the first conventional example, and this is an enlarged view of the wavelength monitor shown in FIG. 15. In FIG. 17, a monitoring laser beam that has been output from the back end surface of the semiconductor laser device 20 is incident to the prism 51 via the parallel lens 35. The laser beam that has been incident to the light incident surfaces 51a and 51b of the prism 51 is divided into a light 82 of an emission angle θ1 and a light 83 of an emission angle θ2 (=θ1) relative to a center line 81 determined according to the shape of the prism 51.

The light 82 is incident straight to the first optical detector 41, and the light 83 is incident to the optical filter 52. A part of the light 83 that has been incident to the optical filter 52 is transmitted through the optical filter 52 and reaches the second optical detector 42, and the reset of the light 83 is reflected by the front surface of the optical filter 52. A reflection light 84 reaches the front surface of the emission surface 51c of the prism 51, and is further reflected as a reflection light 85. The reflection light 85 is substantially equal to the route of the light 82, and therefore, reaches the detection range of the first optical detector 41.

In other words, the first optical detector 41 receives the reflection light 85 as a stray light, in addition to the light 82 divided by the prism 51. Consequently, the output current varies. When this variation occurs, the reference voltage becomes inaccurate, and the wavelength locking becomes unstable. The first optical detector 41 is used not only to generate the reference voltage of the wavelength locking but is also used as a power monitor to control the injection current of the semiconductor laser device 20. Therefore, the above variation causes the interference of the stability of the output power of the semiconductor laser device 20.

According to the laser module 200 in the first conventional example, one component of the reflection light 84 is transmitted through the prism 51, and reaches the semiconductor laser device 20. This may give a bad influence to the oscillation operation of the semiconductor laser device 20.

FIG. 18 is an explanatory view which explains the problems of the second conventional example, and this is an enlarged view of the wavelength monitor shown in FIG. 16. In FIG. 18, a monitoring laser beam that has been output from the back end surface of the semiconductor laser device 20 is incident to the half-mirror 71 via the parallel lens 35. The laser beam that has been incident to the half-mirror 71 is divided into the transmission light 85 and the reflection light 86 according to the disposition of the half-mirror 71 (the inclination in the lateral direction of the main surface relative to the incident direction).

The transmission light 85 is incident straight to the first optical detector 63, and the reflection light 86 is incident to the optical filter 72. A part of the reflection light 86 that has been incident to the optical filter 72 is transmitted through the optical filter 72 and reaches the second optical detector 64, and the reset of the reflection light 86 is reflected by the front surface of the optical filter 72. A reflection light 87 that has been reflected from the front surface of the optical filter 72 reaches the front surface of the half-mirror 71, and is further reflected as a reflection light 88. The reflection light 88 is substantially equal to the route of the laser beam that has been output from the back end surface of the semiconductor laser device 20, and therefore, the reflection light 88 reaches the semiconductor laser device 20. Consequently, this gives a bad influence to the oscillation operation of the semiconductor laser device 20.

SUMMARY OF THE INVENTION

It is an object of the present invention to provide a wavelength monitor capable of reducing the influence of a reflection light that is generated in an optical filter that constitutes the wavelength monitor, and capable of obtaining an optical detection signal of high quality, and a laser module with integrated wavelength monitor.

According to one aspect of the present invention, there is provided a wavelength monitor that detects a change in the wavelength of a laser beam, the wavelength monitor comprising: an optical dividing unit that divides the laser beam into a first light and a second light; a first optical detecting unit that detects the intensity of the first light; an optical filtering unit that has a wavelength characteristic and has a light incident surface disposed at a predetermined angle from a surface perpendicular to the optical axis of the second light so as to transmit a part of the second light through the light incident surface and make the rest of the second light incident into the light incident surface; and a second optical detecting unit that detects the intensity of the light that has been transmitted through the optical filtering unit, wherein the predetermined angle is an angle that has been adjusted such that the other part of the second light that proceeds after being reflected from the light incident surface of the optical filtering unit and further reflected from the light emission surface of the optical dividing unit is not connected to the first optical detecting unit.

According to the above aspect of the invention, the light that has been reflected from the front surface of the optical filtering unit is incident to the optical dividing unit through a route different from the incident route of the second light. Therefore, it is possible to make the route of the reflection light that has been generated by a further reflection of the light from the front surface of the optical dividing unit deviate from the route that has been connected to the first optical detecting unit.

According to another aspect of the invention, there is provided a wavelength monitor that detects a change in the wavelength of a laser beam, the wavelength monitor comprising: an optical dividing unit that divides the laser beam into a first light and a second light; a first optical detecting unit that detects the intensity of the first light; an optical filtering unit that has a wavelength characteristic and has a light incident surface at an angle so as to transmit a part of the second light through the light incident surface and reflect the other portion of the second light from the light incident surface to an upper direction or a lower direction than the incident route of the second light; and a second optical detecting unit that detects the intensity of the light that has been transmitted through the optical filtering unit.

According to the above aspect of the invention, the light that has been reflected from the front surface of the optical filtering unit is incident to the optical dividing unit through a route different from the incident route of the second light. Therefore, it is possible to make the route of the reflection light that has been generated by a further reflection of the light from the front surface of the optical dividing unit deviate from the route of the first light that has been generated by dividing by the optical dividing unit.

According to still another aspect of the invention, there is provided a wavelength monitor that detects a change in the wavelength of a laser beam, the wavelength monitor comprising: an optical dividing unit that has a light incident surface and/or a light emission surface at an angle to divide the laser beam into a first light and a second light, and transmit the laser beam to an upper direction or a lower direction than the incident route of the laser beam; a first optical detecting unit that detects the intensity of the first light; an optical filtering unit that has a wavelength characteristic, and that transmits a part of the second light and reflects the other portion of the second light; and a second optical detecting unit that detects the intensity of the light that has been transmitted through the optical filtering unit.

According to the above aspect of the invention, the light incident surface or the light emission surface of the optical dividing unit is inclined to an upper direction or a lower direction. Therefore, it is possible to make the route of the first light that has been generated by dividing by the optical dividing unit deviate from the route of the light that has been reflected by the optical filtering unit and further reflected from the light emission surface of the optical dividing unit.

According to still another aspect of the invention, there is provided a wavelength monitor that detects a change in the wavelength of a laser beam, the wavelength monitor comprising: a prism that divides the laser beam into a first light and a second light, and has an asymmetrical shape relative to an incident direction of the laser beam as a cross-sectional shape, or has a cross-sectional shape disposed to be asymmetrical relative to the incident direction of the laser beam; a first optical detecting unit that detects the intensity of the first light; an optical filtering unit that has a wavelength characteristic, and that transmits a part of the second light and reflects the other portion of the second light; and a second optical detecting unit that detects the intensity of the light that has been transmitted through the optical filtering unit.

According to the above aspect of the invention, the cross-sectional surface of the prism is asymmetrical relative to the incident laser beam. Therefore, it is possible to make the route of the light that has been reflected by the optical filtering unit and further reflected from the light emission surface of the prism deviate from the route of the first light that has been divides by the prism.

According to still another aspect of the invention, there is provided a wavelength monitor that detects a change in the wavelength of a laser beam, the wavelength monitor comprising: an optical dividing unit that divides the laser beam into a first light and a second light; a first optical detecting unit that detects the intensity of the first light; an optical filtering unit that transmits a part of the second light; and a second optical detecting unit that detects the intensity of the light that has been transmitted through the optical filtering unit, wherein the inclination of a light incident surface and/or a light emission surface of the optical dividing unit or the optical filtering unit relative to the laser beam has been selected to prevent a stray light from the optical filtering unit to the first optical detecting unit.

According to the above aspect of the invention, the light reflected from the front surface of the optical filtering unit is incident to the optical dividing unit through the route that is different from the incident route of the second light. Therefore, it is possible to make the route of the reflection light that has been generated by a further reflection of the light from the surface of the optical dividing unit deviate from the route of the first light that has been divided by the optical dividing unit.

According to still another aspect of the invention, there are provided a laser module comprising a semiconductor laser device that outputs a laser beam, and the wavelength monitor.

According to the above aspect of the invention, it is possible to provide a laser module with integrated wavelength monitor.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 6 is a diagram which shows experiment data of results of detection by a first optical detector of a wavelength monitor according to a conventional example and according to the second embodiment respectively.

DETAILED DESCRIPTION

Embodiments of a wavelength monitor and a laser module with integrated wavelength monitor relating to the present invention will be explained in detail below with reference to the drawings. It should be noted that the present invention is not limited by these embodiments.

Figure 1:
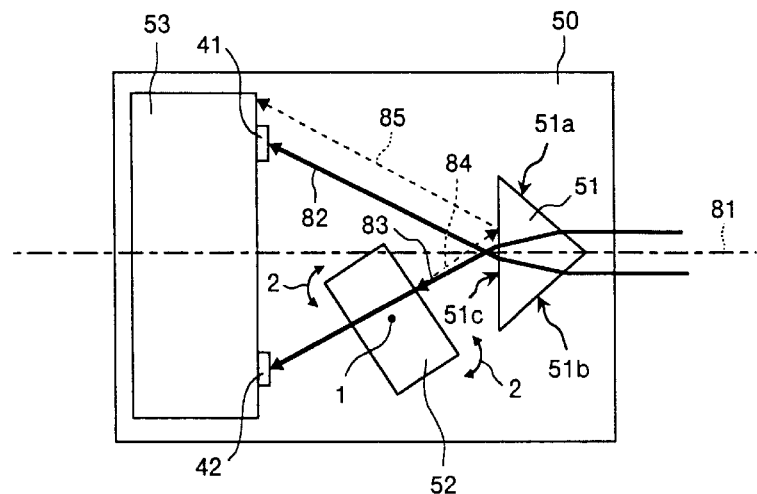
FIG. 1 is a view which shows a schematic structure of a wavelength monitor relating to a first embodiment of the present invention.
Figure 17:
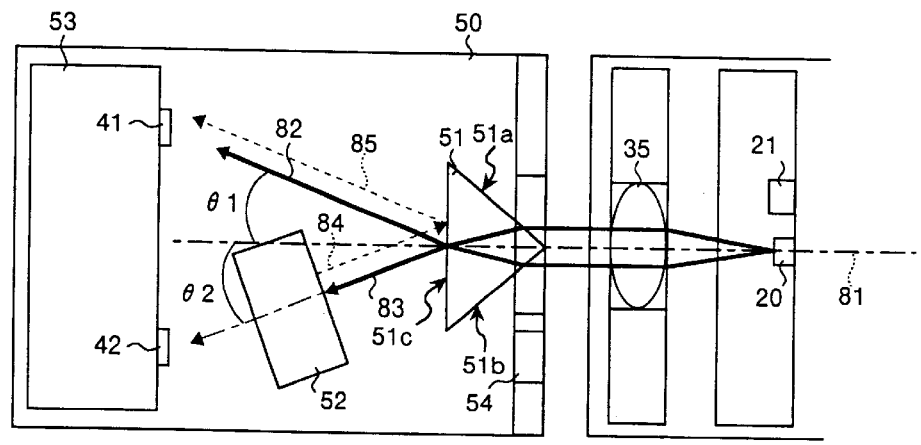
FIG. 17 is a view which explains a problem of the first conventional example.
Figure 18:
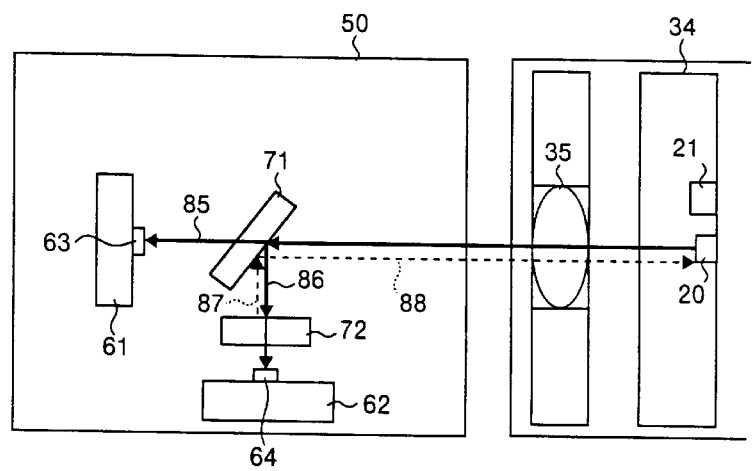
FIG. 18 is a view which explains a problem of the second conventional example.

A wavelength monitor relating to a first embodiment will be explained first. The wavelength monitor relating to the first embodiment has a characteristic in the position to which an optical filter 52 is fixed. A method of determining this position is different from that of the first example. FIG. 1 is a view which shows a schematic structure of the wavelength monitor relating to the first embodiment of the present invention. In FIG. 1, sections that are common to those in FIG. 17 are attached with identical reference symbols, and explanation of these sections will be omitted.

Figure 2:
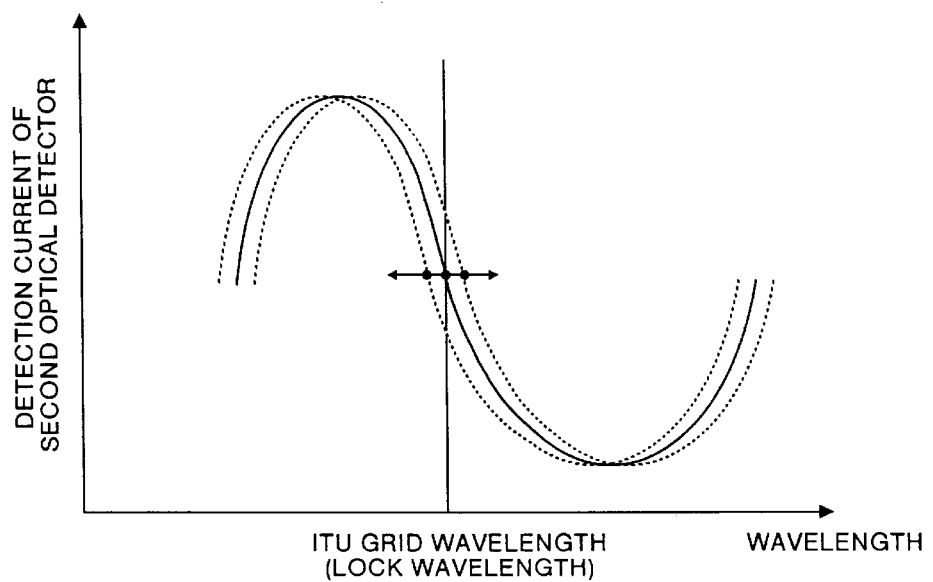
FIG. 2 is a diagram which shows an example of a wavelength discrimination curve that is necessary to adjust a wavelength locking.

When a reflection light 84 from a front surface of the optical filter 52 is further reflected from an emission surface 51c of a prism 51, a reflection light 85 is generated. The optical filter 52 is disposed at an angle which does not cause the route of the reflection light 85 to be led to a first optical detector 41. In FIG. 1, an optimum position is determined by rotating the optical filter 52 around an axis 1 as a rotary axis that becomes the center of the optical filter 52 that is perpendicular to a contact surface of a base 50, as shown in FIG. 2. In other words, the angle of the incident surface of the optical filter 52 relative to the optical axis of a light 83 in one of the directions divided by the prism 51, is adjusted.

The position of the optical filter 52 has also been adjusted so far in the wavelength monitor of the structure shown in the first conventional example. More specifically, the angle relative to the optical axis of the light 83 as one of the lights divided by the prism 51 has been adjusted to be optimum based on a detection current of a second optical detector 42 that receives a monitoring light. This adjusting method will be explained below.

The wavelength locking is carried out by using a wavelength discrimination curve that is obtained from the wavelength of the light that has been transmitted through the optical filter 52 and the detection current of the second optical detector 42. Specifically, the wavelength locking is controlled using a slope of the wavelength discrimination curve. The wavelength discrimination curve shifts on the wavelength axis according to an angle between the light incident surface of the optical filter 52 and the optical axis of the light that is incident to this incident surface. Therefore, it is preferable that the core of the angle of the optical filter 52 is adjusted so that the wavelength to be locked is positioned at the center of the slope of the wavelength discrimination curve.

FIG. 2 is a diagram which shows an example of a wavelength discrimination curve that is necessary to adjust the wavelength locking. As shown by the wavelength discrimination curve in a solid line in FIG. 2, the angle of the optical filter 52 is determined at which the center of the slope of the wavelength discrimination curve is positioned on the lock wave, while monitoring the detection current of the second optical detector 42. In the WDM system, it is particularly necessary that the lock wavelength is an ITU grid wavelength.

However, the core adjustment of the angle at which only the detection current of the second optical detector 42 is monitored does not take into account the incidence of the reflection light to the first optical detector 41. Therefore, in the present embodiment, the fixed position of the optical filter 52 is determined at a position that is optimum to realize the wavelength locking, and the position at which the reflection light incident to the first optical detector 41 becomes minimum. Specifically, at the time of fixing the optical filter 52, both the detection current of the first optical detector 41 and the detection current of the second optical detector 42 are monitored in advance. While confirming that the reflection light is not connected to the first optical detector 41, the core of the angle of the optical filter 52 is adjusted so that the slope center of the wavelength discrimination curve obtained by the second optical detector 42 is positioned at the ITU grid.

Figure 3:
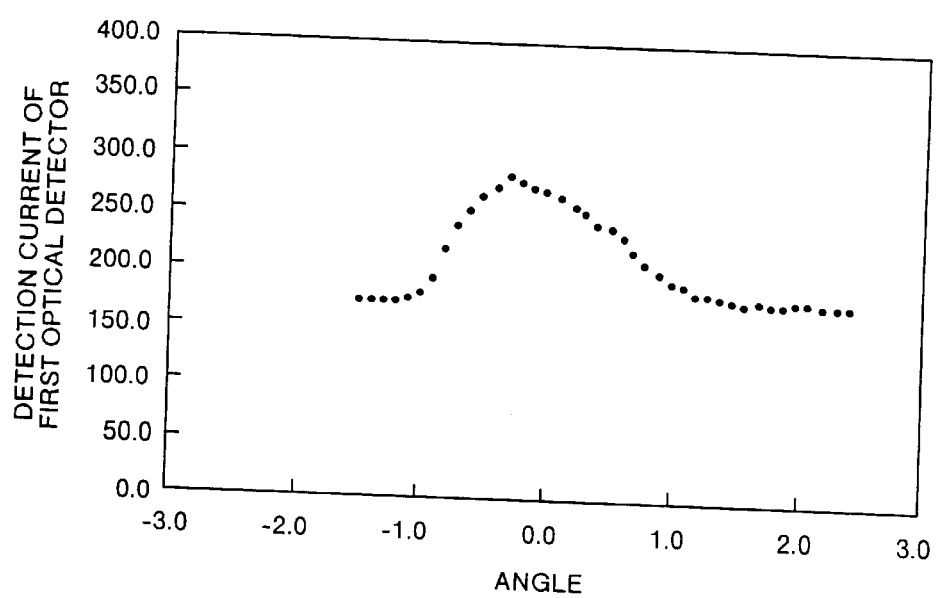
FIG. 3 is a diagram which shows a relationship between a detection current of a first optical detector and an angle of an optical filter.

FIG. 3 is a diagram which shows a relationship between a detection current of the first optical detector 41 and an angle of the optical filter 52. As shown in FIG. 3, according to the relationship between a detection current of the first optical detector 41 and an angle of the optical filter 52, the reflection light of the optical filter 52 that is connected to the first optical detector 41 becomes maximum at the angle near zero degree. Therefore, the etalon angle adjustment is carried out at the angle of the optical filter 52 at which this reflection light does not exist. In the example shown in FIG. 3, there is no influence of the reflection light, when the angle of the optical filter 52 is ± one degree or larger. Within this angle range, the angle of the optical filter 52 is adjusted so that the ITU grid is disposed at the center of the slope of the wavelength discrimination curve.

As explained above, according to the wavelength monitor relating to the first embodiment, the optical filter 52 is disposed at a position that satisfies both an optimum condition for carrying out the wavelength locking and a reduction of the reflection light that is connected to the first optical detector 41. Therefore, it is possible to stabilize the oscillation operation of the semiconductor laser device 20. At the same time, the first optical detector 41 can obtain the optical detection signal of high quality. As a result, it is possible to realize the stable wavelength control (temperature control) like wavelength locking.

Figure 4:
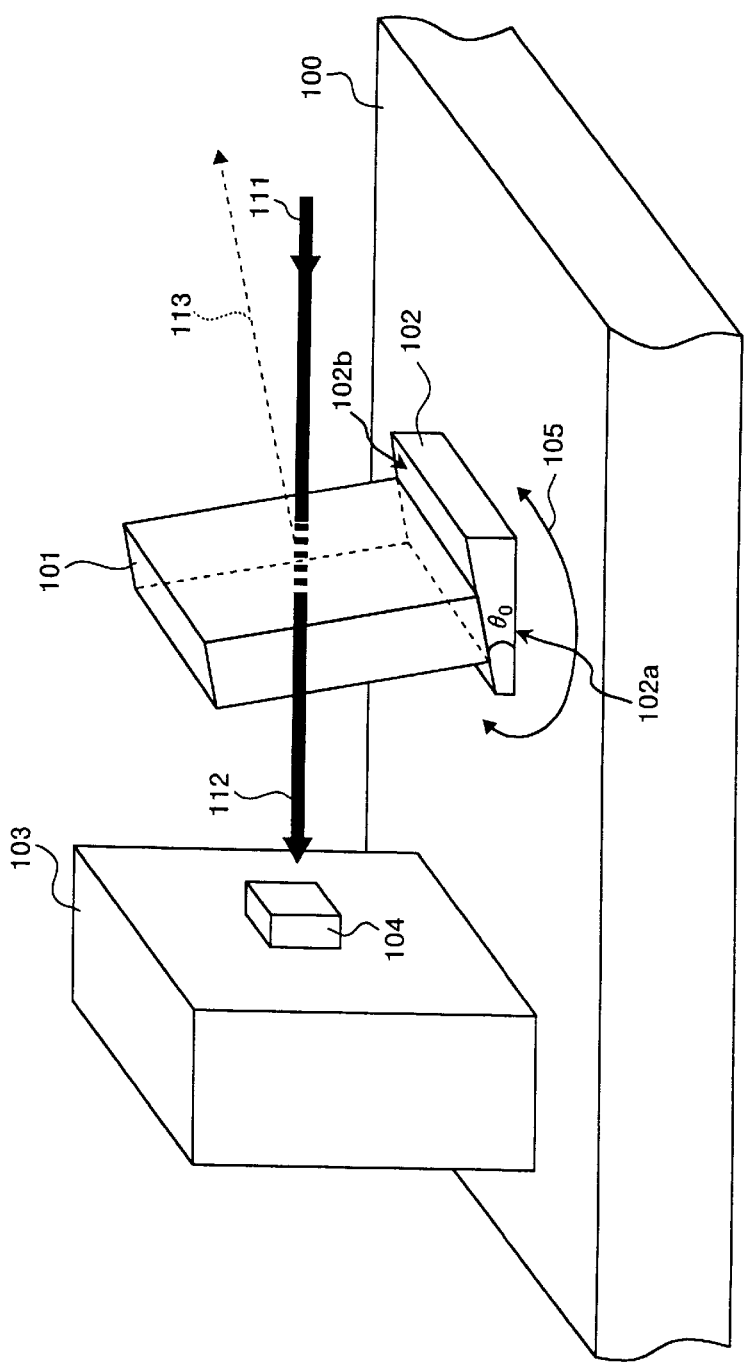
FIG. 4 is a view which shows a schematic structure of a wavelength monitor relating to a second embodiment of the present invention.

A wavelength monitor relating to a second embodiment will be explained next. FIG. 4 is a view which shows a schematic structure of the wavelength monitor relating to the second embodiment of the present invention. In FIG. 4, a base 100 corresponds to the base 50 that has been explained in the first and second conventional examples. A sub-mount 103 corresponds to the sub-mount shown in FIG. 15 or the sub-mount 62 shown in FIG. 16. An optical detector 104 corresponds to the second optical detector 42 shown in FIG. 15 or the optical detector 64 shown in FIG. 16.

Figure 15:
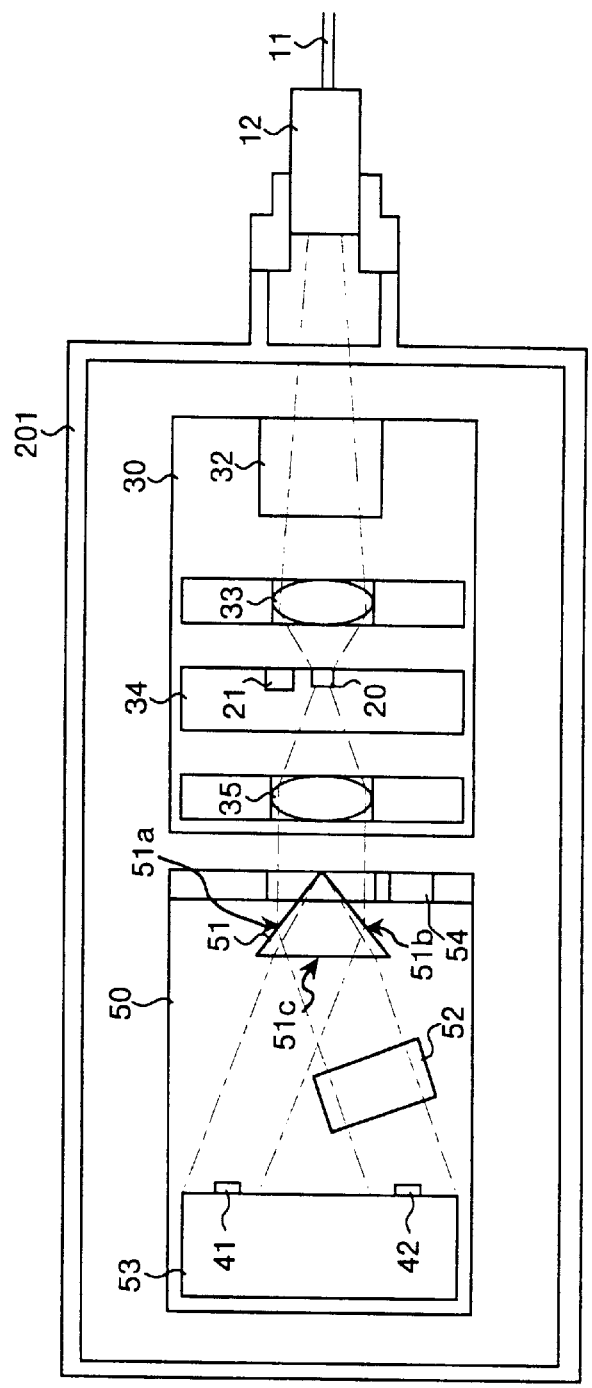
FIG. 15 is a top plan cross-sectional view of a laser module which shows a first conventional example.
Figure 16:
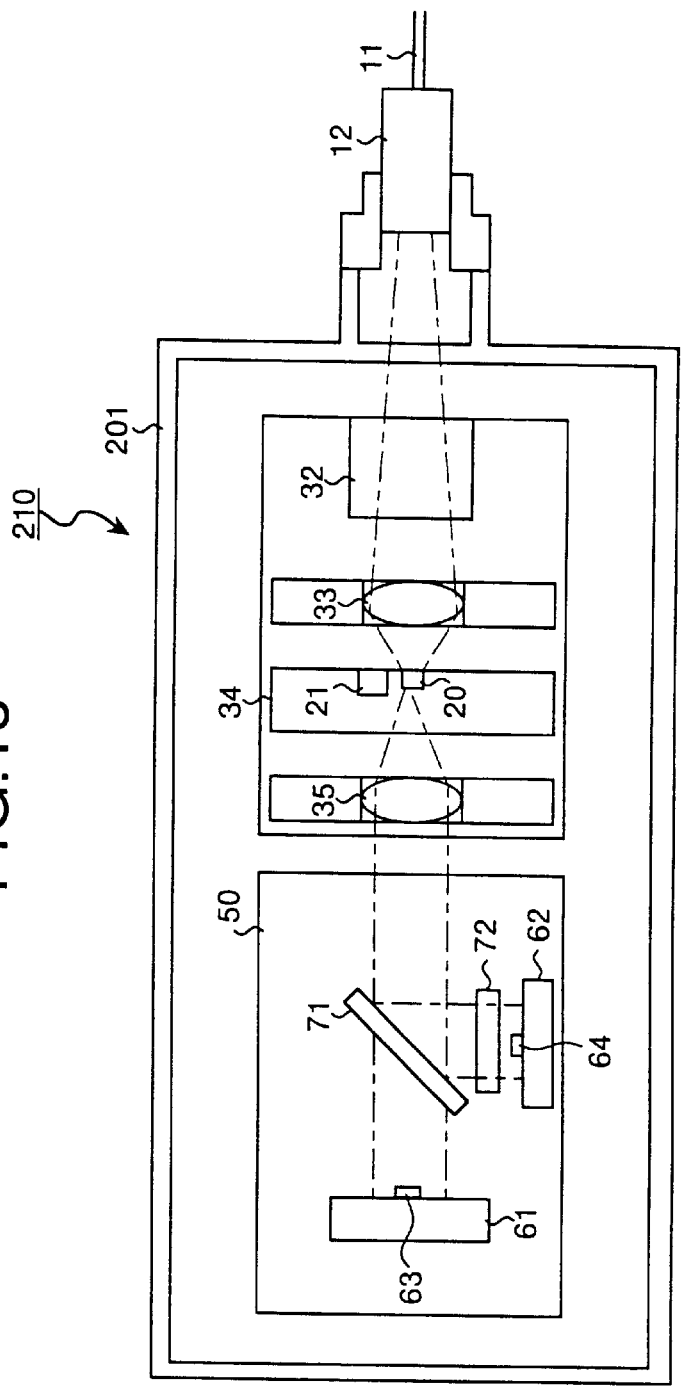
FIG. 16 is a top plan cross-sectional view of a laser module which shows a second conventional example.

Particularly, in the wavelength monitor shown in FIG. 4, an optical filter 101 and a supporting base 102 for this optical filter 101 are disposed in place of the optical filter 52 shown in FIG. 15 or the optical filter 72 shown in FIG. 16. The supporting base 102 is formed as a quadratic prism that has a tapered angle of a predetermined angle $\theta_0$ between a lower surface 102a of the supporting base 102 that faces the base 100 and an upper surface 102b of the supporting base 102 on which the optical filter 101 is mounted, as shown in FIG. 4. The supporting base 102 is disposed on the base 100 so that the upper surface 102b forms a slope on the upper surface of the base 100. The optical filter 101 is provided on the upper surface of the supporting base 102. In other words, the incident surface of the laser beam on the optical filter 101 is inclined relative to the incident direction of the laser beam.

With this arrangement, a light 111 that is incident to the optical filter 101 is transmitted through the optical filter 101 as a transmission light 112, and is also reflected to a direction large deviated from the incident route of the light 111, as a reflection light 113. The optical filter 101 is fixed onto the supporting base 102 and is integrated together. The wavelength characteristic and the intensity of the light after the light has been transmitted through the optical filter 101 are adjusted to optimum values by moving or rotating the supporting base 102 to a direction parallel with the upper surface of the base 100, as shown by an arrow mark 105 in FIG. 4.

Figure 5A:
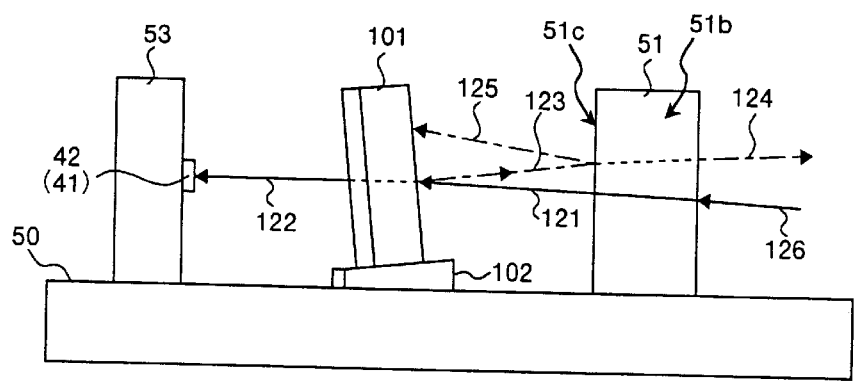
FIG. 5A and FIG. 5B are views which explain the effects of using an optical filter and a supporting base of the wavelength monitor relating to the second embodiment in wavelength monitors of conventional examples.
Figure 5B:
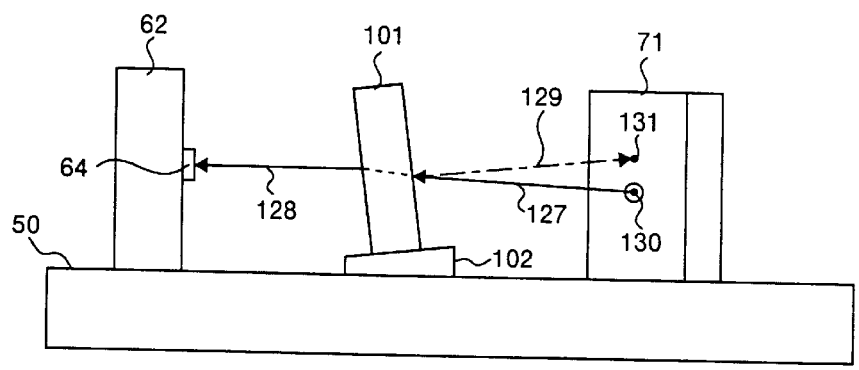

FIG. 5A and FIG. 5B are views which explain the effects of using the optical filter 101 and the supporting base 102 in the wavelength monitors of the conventional examples. FIG. 5A is a view which explains the effect of using the optical filter 101 and the supporting base 102 in the wavelength monitor of the first conventional example shown in FIG. 15. Particularly, FIG. 5A is a cross-sectional view of the structure shown in FIG. 17 that is cut along the route of the light 83.

FIG. 5A will be explained first. A monitoring laser beam 126 that has been output from the back end surface of a semiconductor laser device 20 not shown is divided by a prism 51 into a light that is directed to a first optical detector 41 and a light 121 that is directed to the optical filter 101. The light that is directed to the first optical detector 41 reaches the first optical detector 41 that is disposed on a sub-mount 53.

On the other hand, the light 121 that is directed to the optical filter 101 is incident to the optical filter 101. At this time, this light 121 is divided into a transmission light 122 that is directed to a second optical detector 42 and a reflection light 123 that is reflected from the surface of the optical filter 101. As the incident surface of the optical filter 101 is inclined to face upward relative to the upper surface of the base 50 as described above, the reflection light 123 proceeds through the upward route that is deviated from the route of the light 121. When the reflection light 123 has reached the surface of the prism 51, this reflection light 123 is divided into a transmission light 124 and a reflection light 125.

The transmission light 124 proceeds in the direction in which a laser section is present. As the transmission light 124 is deviated upward from the route of the laser beam 126 that has been output from the back end surface of the semiconductor laser device 20 not shown, the transmission light 124 that reaches the semiconductor laser device 20 is reduced. Therefore, it is possible to reduce the influence of the transmission light 124 that is applied to the oscillation operation of the semiconductor laser device 20.

On the other hand, the reflection light 125 in the horizontal direction proceeds to a direction of the first optical detector 41, as this horizontal direction of the reflection light 125 substantially coincides with the direction of the first optical detector 41 of the sub-mount 53. However, as the reflection light 125 in the vertical direction is deviated upward from the first optical detector 41, the reflection light 15 that reaches the first optical detector 41 is reduced. Therefore, it is possible to prevent the interference with the light that is directed to the first optical detector 41.

As a result, it is possible to prevent the stray lights of the reflection light 123, the reflection light 125 and the transmission light 124 from affecting the oscillation operation of the semiconductor laser device 20 and the detection of the first optical detector 41.

FIG. 5B will be explained next. A light 127 that has been divided by a half-mirror 71 to direct to a second optical detector 64 is incident to the optical filter 101. At this time, this light 127 is divided into a transmission light 128 that is directed to a second optical detector 64 and a reflection light 129 that is reflected from the surface of the optical filter 101. As the incident surface of the optical filter 101 is inclined to face upward relative to the upper surface of the base 50 as described above, the reflection light 129 proceeds through the upward route that is deviated from the route of the light 127.

The reflection light 129 that has reached the front surface of the half-mirror 71 further proceeds to a direction in which a laser section is disposed (this direction on the paper), as a reflection light 131. However, the route of this reflection light 131 is large deviated from the route of a laser beam 130 that has been output from the back end surface of the semiconductor laser device 20 not shown. Therefore, it is possible to reduce the influence of the reflection light 129 reaching the semiconductor laser device 20 that is applied to the oscillation operation of the semiconductor laser device 20.

FIG. 6 is a diagram which shows experiment data of results of detection by the first optical detector of the wavelength monitor according to the first conventional example and according to the second embodiment respectively. In FIG. 6, a solid line 91 shows changes in the current of the first optical detector 41 that is disposed in the first conventional example. It can be understood from this solid line that as the injection current to the semiconductor laser device 20 increases, that is, as the output power of the laser beam increases, unstable detection current is output, which is a result of the influence of the stray lights. A dotted line 92 shows changes in the current of the first optical detector 41 that is disposed in the laser module relating to the second embodiment. It can be understood from this dotted line that even when the injection current to the semiconductor laser device 20 increases, a stable characteristic is obtained, which is not affected by the stray lights.

As explained above, according to the wavelength monitor relating to the second embodiment, the light incident surface of the optical filter 52 is disposed with an inclination relative to the light incident direction. Therefore, it is possible to make the route of the light that has been reflected from the light incident surface deviate large from the route of the light that has been incident to the optical filter 52. Consequently, it is possible to prevent the reflection light from being incident to the semiconductor laser device 20 and the first optical detector 41. With this arrangement, it is possible to stabilize the oscillation operation of the semiconductor laser device 20, and the first optical detector 41 can obtain the optical detection signal of high quality. As a result, it is possible to realize the stable wavelength control (temperature control) like wavelength locking.

In the second embodiment, the upper surface of the supporting base 102 is inclined, and this supporting base can be formed with a material of good processability like metal. Therefore, this provides satisfactory productivity. It is also possible to enjoy a similar effect when the supporting base 102 is eliminated, or when a supporting base having upper and lower surfaces approximately in parallel is used, and the optical filter 101 having an inclined light incident surface is used (the cross-section may be a parallelogram or a trapezoid).

A wavelength monitor relating to a third embodiment will be explained next. The wavelength monitor relating to the third embodiment uses a prism having an inclined light incident surface in the wavelength monitor of the first conventional example.

Figure 7:
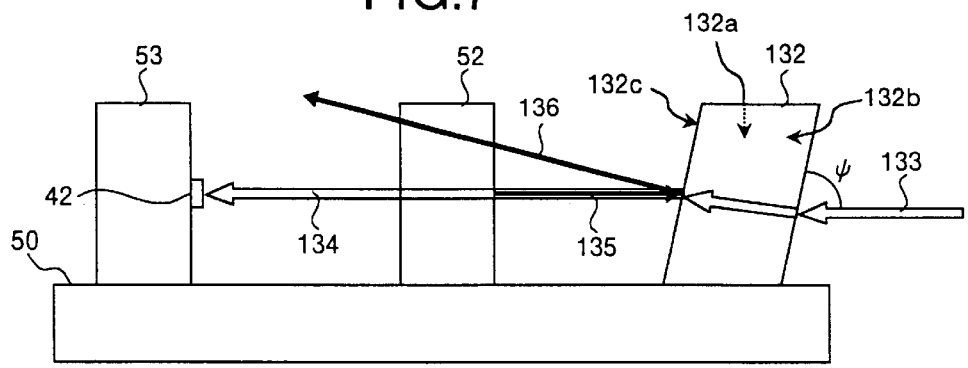
FIG. 7 is a view which explains a wavelength monitor relating to a third embodiment of the present invention.

FIG. 7 is a view which explains the wavelength monitor relating to the third embodiment of the present invention. Particularly, FIG. 7 is a cross-sectional view of the structure that is cut along the route of the light that has been divided to the optical filter direction by the prism. In FIG. 7, sections that are common to those shown in FIG. 15 are attached with identical reference symbols, and explanation of these sections will be omitted.

The wavelength monitor shown in FIG. 7 has a prism 132 in a different shape as that of the prism shown in FIG. 15. As shown in FIG. 7, the prism 132 has a parallelogram shape in its side cross section. The prism 132 is constructed of two light incident surfaces 132a and 132b having an inclination of an acute angle ψ relative to the incident direction of a monitoring laser beam 133 that has been output from the back end surface of a semiconductor laser device 20 not shown, and a light emission surface 132c. In other words, the prism 132 shown in FIG. 7 has a shape that the prism shown in FIG. 15 is inclined in total to the incident side of the monitoring laser beam 133.

In FIG. 7, the monitoring laser beam 133 that is output from the back end surface of the semiconductor laser device 20 not shown is incident to inclined light incident surfaces 132a and 132b of the prism 132. The light is diffracted and divided into a light that is directed to a first optical detector 41 not shown and a light that is directed to an optical filter 52. The divided lights are emitted from a light emission surface 132c.

The light that is directed to the first optical detector 41 not shown reaches the first optical detector 41 that is disposed on a sub-mount 53. On the other hand, the light that is directed to the optical filter 52 is incident to the optical filter 52, and is divided into a transmission light 134 that is directed to a second optical detector 42 and a reflection light 135 that is reflected from the front surface of the optical filter 52. The reflection light 135 proceeds through a route substantially, opposite to the route of the transmission light 134, and reaches the front surface of the light emission surface 132c of the prism 132. Further, this light is reflected at a predetermined upward angle on the front surface of the light emission surface 132c of the prism 132. This light proceeds as a reflection light 136. While the reflection light 136 proceeds to a direction of the sub-mount 53, this light cannot reach the first optical detector 41, as the route of this light is large deviated from the route of the light that proceeds to the first optical detector 41. Consequently, there occurs no interference with the light that is directed to the first optical detector 41.

Figure 8:
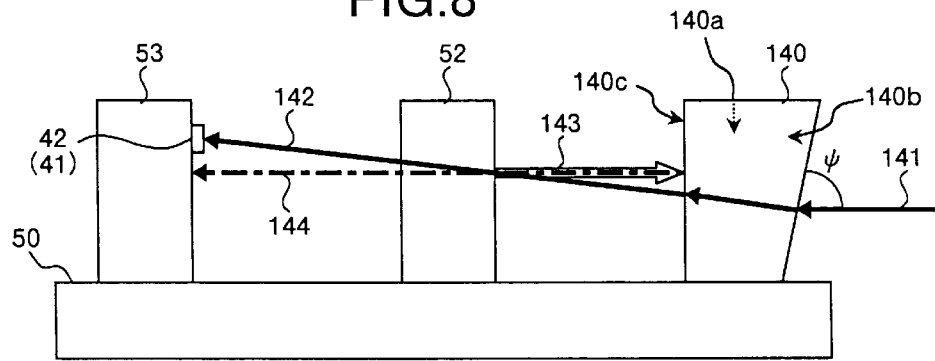
FIG. 8 is a view which explains a wavelength monitor relating to another example of the third embodiment.

FIG. 8 is a view which explains a wavelength monitor relating to another example of the third embodiment. Particularly, FIG. 8 is a cross-sectional view of the structure that is cut along the route of the light that has been divided to the optical filter direction by the prism. In FIG. 8, sections that are common to those shown in FIG. 15 are attached with identical reference symbols, and explanation of these sections will be omitted.

While the side cross section of the prism 132 shown in FIG. 7 has a parallelogram shape, the side cross section of a prism 140 shown in FIG. 8 has a trapezoidal shape. Light incident surfaces 140a and 140b of the prism 140 are formed as inclined surfaces having an acute angle ψ relative to the incident direction of a monitoring laser beam 141 that has been output from the back end surface of a semiconductor laser device 20 not shown. A light emission surface 140c is perpendicular to the incident direction of the monitoring laser beam 141.

In FIG. 8, the monitoring laser beam 141 that is output from the back end surface of the semiconductor laser device 20 not shown is incident to inclined light incident surfaces 140a and 140b of the prism 140. The light is diffracted and divided into a light that is directed to a first optical detector 41 not shown and a light that is directed to an optical filter 52. Both divided lights are emitted from the perpendicular surface 140c at a predetermined upward angle.

The light that is directed to the first optical detector 41 not shown reaches the first optical detector 41 that is disposed on a sub-mount 53. On the other hand, the light that is directed to the optical filter 52 is incident to the optical filter 52, and is divided into a transmission light 142 that is directed to a second optical detector 42 and a reflection light 143 that is reflected from the front surface of the optical filter 52. The reflection light 143 is further reflected from the front surface of the perpendicular surface of the prism 140 so that the horizontal direction of this reflection light coincides with the direction of the first optical detector 41 of the sub-mount 53. This light proceeds as a reflection light 144. As the route of this reflection light 144 in the perpendicular direction is large deviated from the route to the first optical detector 41, the reflection light 144 that reaches the first optical detector 41 is reduced. Consequently, it is possible to prevent interference with the light that is directed to the first optical detector 41.

As explained above, according to the wavelength monitor relating to the third embodiment, the prism having a shape of inclined light incident surfaces is used. Therefore, it is possible to make the proceeding direction of the light that has been divided by the prism (132, 140) and directed to the first optical detector 41 deviate large from the proceeding direction of the light that has been reflected by the optical filter 52 and the prism (132, 140). This makes it possible to prevent the reflection light from being incident to the first optical detector 41. Consequently, the first optical detector 41 can obtain the optical detection signal of high quality. As a result, it is possible to realize the stable wavelength control (temperature control) like wavelength locking.

While the second embodiment and the third embodiment have a structure of reflecting the light to an upper side, it is needless to mention that the light may be reflected to a lower side.

A wavelength monitor relating to a fourth embodiment will be explained next. The wavelength monitor relating to the fourth embodiment uses a prism with its triangular cross section formed to have all different three angles by two light incident surfaces and one light emission surface in the wavelength monitor of the first conventional example.

Figure 9:
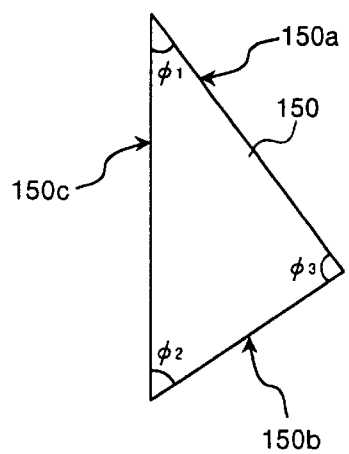
FIG. 9 is a cross-sectional view of a prism used in a wavelength monitor relating to a fourth embodiment of the present invention.

FIG. 9 is a cross-sectional view of the prism used in the wavelength monitor relating to the fourth embodiment of the present invention. In the first conventional example shown in FIG. 17, the prism 51 has a cross section of an isosceles triangle with equal angles for the angles $\theta_1$ and $\theta_2$ of the two divided lights 82 and 83 in order to easily connect these lights to the first optical detector 41 and the second optical detector 42 respectively. On the other hand, a prism 150 that is used in the wavelength monitor relating to the fourth embodiment has a triangular cross section having three inner angles $\phi_1$, $\phi_2$, and $\phi_3$ all different as shown in FIG. 9. This prism is formed in a triangular prism having side surfaces 150a, 150b, and 150c respectively.

Figure 10:
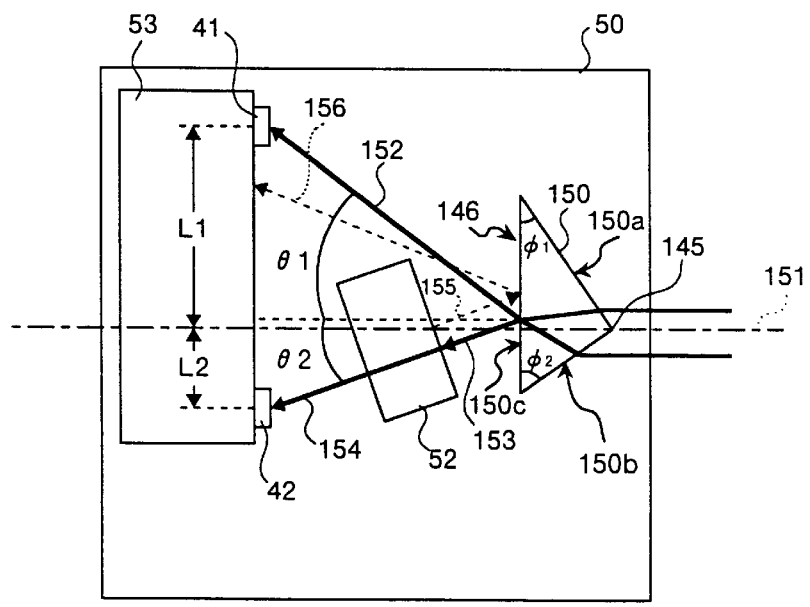
FIG. 10 is a top plan cross-sectional view of the wavelength monitor relating to the fourth embodiment.

FIG. 10 is a top plan cross-sectional view of the wavelength monitor relating to the fourth embodiment. In FIG. 10, sections that are common to those in FIG. 17 are attached with identical reference symbols, and explanation of these sections will be omitted. The wavelength monitor shown in FIG. 10 is different from the wavelength monitor shown in FIG. 15 in that the prism 150 shown in FIG. 9 is used in place of the prism 51 having the isosceles triangle in the cross section.

In FIG. 10, the center route of the laser beam that is output from the back end surface of a semiconductor laser device 20 not shown is expressed as a center line 151. The prism 150 is disposed such that its light emission surface 150c is perpendicular to the center line 151, and a vertical angle 145 opposite to the light emission surface 150c is positioned on the center line 151.

When a laser beam has been input to the prism 150, a light 152 that has been divided at the angle $\theta_1$ from the direction perpendicular to the light emission surface 150c proceeds to a first optical detector 41. A light 153 that has been divided at the angle $\theta_2$ from the direction perpendicular to the light emission surface 150c proceeds to a second optical detector 42. As the division angles of the light 152 and the light 153 are different, it is necessary to determine the position of a sub-mount 53 or the position of each optical detector such that the first optical detector 41 is disposed at a position with a distance L1 from the center line 151, and the second optical detector 42 is disposed at a position with a distance L2 (<L1) from the center line 151.

Therefore, the light 152 that proceeds to the first optical detector 41 reaches the first optical detector 41 that is disposed on the sub-mount 53. On the other hand, the light 153 that proceeds to the optical filter 52 is incident to the optical filter 52, and is divided into a transmission light 154 that proceeds to the second optical detector 42 and a reflection light 155 that is reflected from the front surface of the optical filter 52. The reflection light 155 proceeds through a route that is substantially opposite to the route of the light 153, and reaches the light emission surface 150c of the prism 150. This light is further reflected toward the sub-mount 53, and proceeds as a reflection light 156. While this reflection light 156 proceeds to the direction of the sub-mount 53, the reflection light 156 that reaches the first optical detector 41 is reduced, as the route of the reflection light 156 is large deviated in the horizontal direction from the route of the light 152 that is directed to the first optical detector 41. Therefore, it is possible to prevent the interference with the light 152 that is directed to the first optical detector 41.

Figure 11:
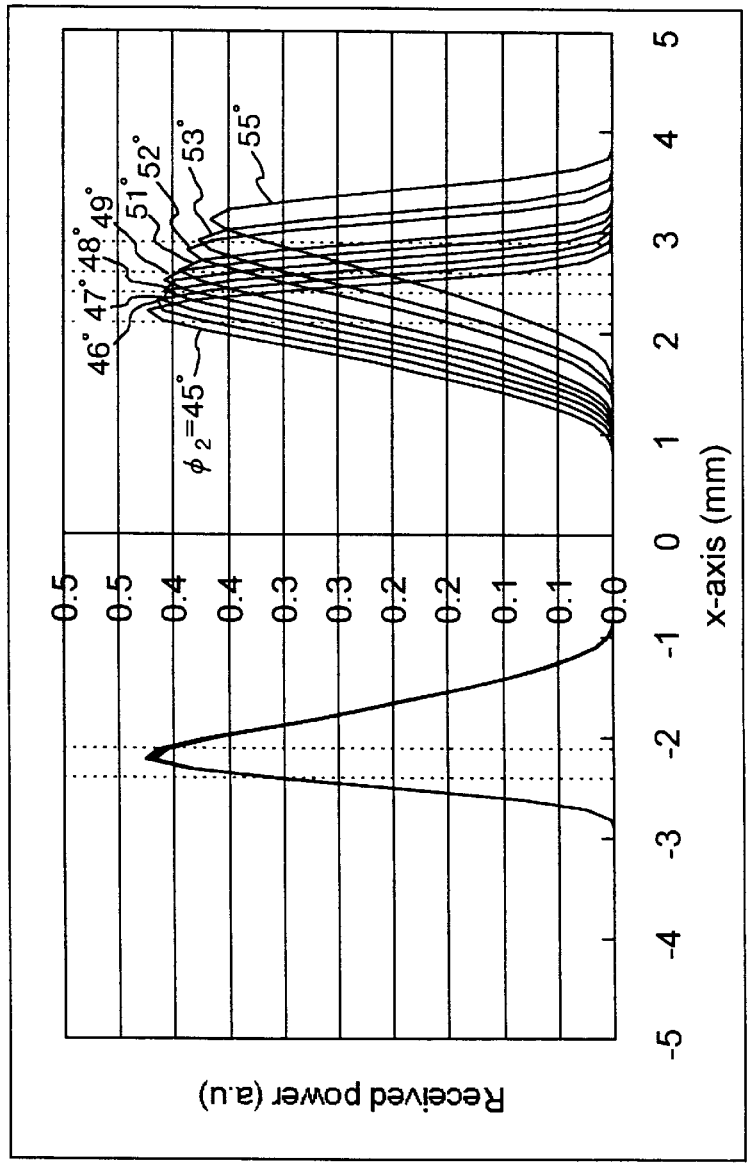
FIG. 11 is a graph which shows a relationship between the internal angle of the prism and a distribution of light intensity in the wavelength monitor relating to the fourth embodiment.

Although the inner angles $\phi_1$, $\phi_2$, and $\phi_3$ are not determined independently in the asymmetrical prism, it is preferable that optimum angles are designed as $40° \leq \phi_1 \leq 50°$, and $\phi_1 - 10 \leq \phi_2 \leq \phi_1 + 10$, when $\phi_1$ is a reference angle, for example. This is because when the incident angle of the light incident to the prism is too small, the light intensity distribution of the laser beam is spread, and the quantity of the light received by the optical detector is reduced. On the other hand, when the incident angle of the light incident to the prism is too large, it is not possible to obtain a sufficient division angle, and the quantity of the light received by the optical detector is also reduced. FIG. 11 shows a structure of the light intensity distribution of the light that is received by a light receiver when the angle of $\phi_2$ is changed by keeping the angle of $\phi_1$ at 45° in the structure shown in FIG. 10. In FIG. 11, the horizontal axis corresponds to the distance L1. It is desirable that the angle of $\phi_2$ is large different from the angle of $\phi_1$ in order to prevent the reflection light 156 from reaching the first optical detector 41. However, when $\phi_2$ is deviated, the center position of the light intensity distribution is deviated, and the peak intensity also becomes small, as shown in FIG. 11. Therefore, the light quantity of the light received by the first optical detector 41 is reduced.

As explained above, according to the wavelength monitor relating to the fourth embodiment, the prism 150 having a triangular cross section with three angles all different is used. Therefore, it is possible to make the route of the light that has been divided by the prism 50 and directed to the first optical detector 41 deviate large from the proceeding direction of the light that has been reflected from the optical filter 52 and the prism 150. This makes it possible to prevent the reflection light from being incident to the first optical detector 41. Consequently, the first optical detector 41 can obtain the optical detection signal of high quality. As a result, it is possible to realize the stable wavelength control (temperature control) like wavelength locking.

While the cross section of the prism explained in the fourth embodiment has a triangular shape, it is also possible to use a prism having a cross section in other polygonal shapes like a trapezoid so long as the cross section has an asymmetrical shape.

A wavelength monitor relating to a fifth embodiment will be explained next. The wavelength monitor relating to the fifth embodiment uses a prism that has a predetermined angle between the light emission surface and a surface that is perpendicular to the optical axis of the incident light in the wavelength monitor of the first conventional example. In other words, the prism is disposed such that the cross sectional shape is asymmetrical relative to the incident direction of the laser beam.

Figure 12A:
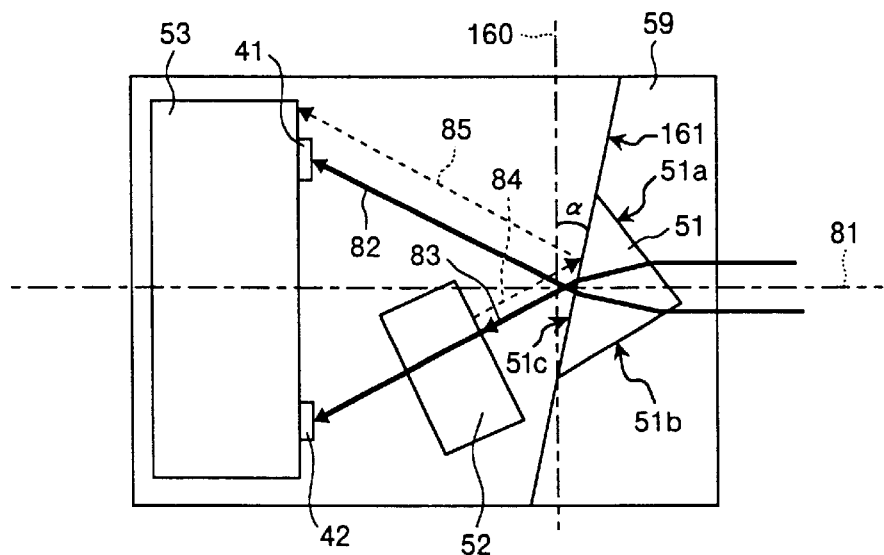
FIG. 12A and FIG. 12B are a top plan cross-sectional view and a side cross-sectional view respectively which shows an example of a wavelength monitor relating to a fifth embodiment of the present invention.
Figure 12B:
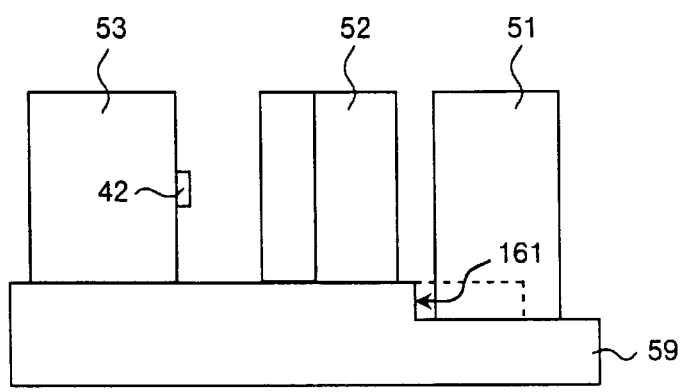

FIG. 12A and FIG. 12B are a top plan cross-sectional view and a side cross-sectional view respectively which shows an example of the wavelength monitor relating to the fifth embodiment of the present invention. In FIG. 12A and FIG. 12B, sections that are common to those shown in FIG. 17 are attached with identical reference symbols, and explanation of these sections will be omitted. The top plan cross-sectional view shown in FIG. 12A is different from that shown in FIG. 17 in the layout position of a prism 51. In FIG. 17, the light emission surface 51c of the prism 51 is perpendicular to the center line 81. However, in FIG. 12A and FIG. 12B, the prism 51 is disposed such that the light emission surface 51c is positioned on the surface at an angle $\alpha$ from a surface 160 that is perpendicular to the center line 81.

Particularly, this angle $\alpha$ is an angle at which a light 82 that has been divided by the prism 51 is connected to a first optical detector 41, and a reflection light 85 that has been reflected from a light emission surface 51c of the prism and proceeds is not connected to the first optical detector 41. With this arrangement, there is small influence that the first optical detector 41 receives from the reflection light 85.

As shown in the side cross-sectional view in FIG. 12B, it is preferable that a base 59 has a stage formed between a surface on which the prism 51 is disposed and a surface on which an optical filter 52 and a sub-mount 53 are disposed. Particularly, this staged surface 161 is formed such that this surface is perpendicular to a contact surface of the light emission surface 51c, that is the upper surface of the base 59, and is positioned on the surface that has the angle α. Based on the existence of this staged surface 161, it is possible to position the prism 51 easily. Specifically, the layout is determined by bringing the light emission surface 51c of the prism 51 into contact with the staged surface 161.

Figure 13A:
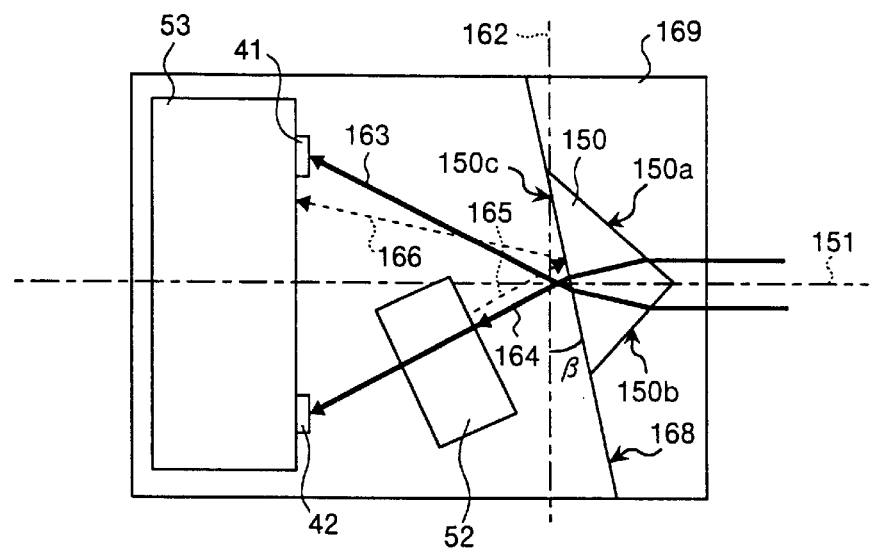
FIG. 13A and FIG. 13B are a top plan cross-sectional view and a side cross-sectional view respectively which shows another example of a wavelength monitor relating to the fifth embodiment.
Figure 13B:
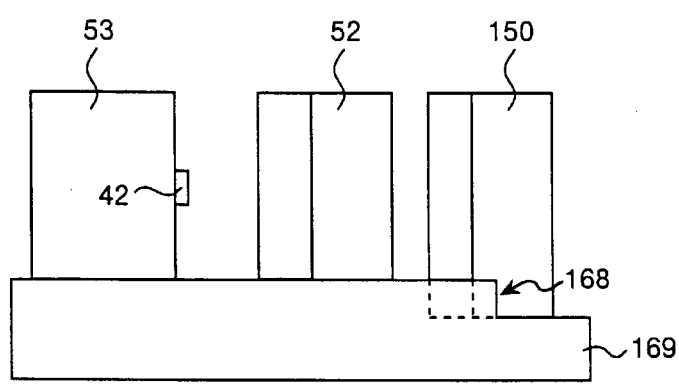

The prism that is used in the fifth embodiment may be a prism having a scalene triangular shape in its cross section as explained in the fourth embodiment. FIG. 13A and FIG. 13B are a top plan cross-sectional view and a side cross-sectional view respectively which shows another example of the wavelength monitor relating to the fifth embodiment. In FIG. 13A and FIG. 13B, sections that are common to those shown in FIG. 10 are attached with identical reference symbols, and explanation of these sections will be omitted. The top plan cross-sectional view shown in FIG. 13A is different from that shown in FIG. 10 in the layout position of a prism 150. In FIG. 10, the light emission surface 150c of the prism 150 is perpendicular to the center line 151. However, in FIG. 13A and FIG. 13B, the prism 150 is disposed such that the light emission surface 150c is positioned on the surface at an angle β from a surface 162 that is perpendicular to the center line 151.

As shown in FIG. 13B, a base 169 can also take a staged shape having a stage provided between a surface on which the prism 150 is disposed and a surface on which an optical filter 52 and a sub-mount 53 are disposed, like that shown in FIG. 12B.

As explained above, according to the wavelength monitor relating to the fifth embodiment, the prism 51 or 150 is disposed to have a predetermined angle between the light emission surface and the surface that is perpendicular to the optical axis of the incident light. Therefore, it is possible to make the route of the light that has been divided by the prism 50 or 150 and directed to the first optical detector 41 deviate large from the proceeding direction of the light that has been reflected from the optical filter 52 and the prism 51 or 150. This makes it possible to prevent the reflection light from being incident to the first optical detector 41. Consequently, the first optical detector 41 can obtain the optical detection signal of high quality. As a result, it is possible to realize the stable wavelength control (temperature control) like wavelength locking.

Figure 14:
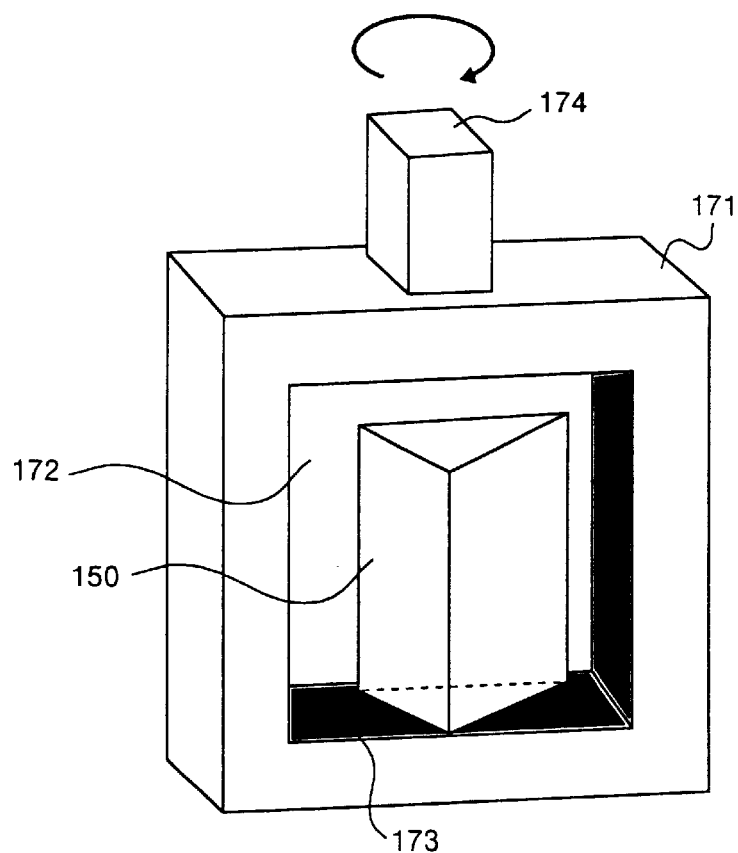
FIG. 14 is a perspective view which shows a holder that makes it possible to position a prism.

In the fourth and fifth embodiments, it is possible to utilize a holder that facilitates the positional adjustment in order to position the prism 51 or 150. FIG. 14 is a perspective view which shows a holder that makes it possible to position the prism 150, as an example. A holder 171 shown in FIG. 14 has an opening 172 provided in its inside. The prism 150 is fixed to a bottom surface 173 of the holder 171 having the opening 172. At the time of installing the prism 150, this holder 171 is disposed on the base. A projection 174 that is provided on the top of the holder 171 is grasped, and a layout position and a layout angle are adjusted. Specifically, while monitoring the current that is output from the first optical detector 41 and the second optical detector 42 respectively, the position and the angle of the prism on the base are adjusted so that the connection efficiency of the connection of the laser beam to each optical detector is maximized.

As explained above, according to one aspect of the wavelength monitor relating to the present invention, the optical filtering unit is fixed at a position where the light that has been sequentially reflected from the front surface of the optical filtering unit and the light emission surface of the prism is not guided to the first optical detecting unit that becomes the power monitor. Therefore, it is possible to prevent the stray lights from being incident to the first optical detecting unit. As a result, there is an effect that the first optical detecting unit can realize the high-quality optical detection and the stable wavelength control (temperature control) like wavelength locking.

According to another aspect of the wavelength monitor relating to the present invention, the light incident surface of the optical filtering unit is disposed with an inclination relative to the light incident direction. Therefore, it is possible to make the route of the light that has been reflected from the light incident surface deviate large from the route of the light that has been incident to the optical filtering unit. As a result, there is an effect that it is possible to prevent the reflection light from being incident to the semiconductor laser device and the first optical detecting unit. Further, there is an effect that it is possible to realize the stabilized oscillation operation of the semiconductor laser device, and the high-quality optical detection of the first optical detecting unit.

According to still another aspect of the wavelength monitor relating to the present invention, the prism having a shape of inclined light incident surfaces is used. Therefore, it is possible to make the proceeding direction of the light that has been divided by the prism and directed to the first optical detecting unit deviate large from the proceeding direction of the light that has been reflected by the optical detecting unit and the prism. As a result, there is an effect that it possible to realize the prevention of the reflection light from being incident to the first optical detecting unit, and the high-quality optical detection of the first optical detecting unit.

According to still another aspect of the wavelength monitor relating to the present invention, the prism having a cross section asymmetrical relative to the incident direction of the laser beam is used. Therefore, it is possible to make the route of the light that has been divided by the prism and directed to the first optical detecting unit deviate large from the proceeding direction of the light that has been reflected from the optical filtering unit and the prism. Therefore, there is an effect that it possible to realize the prevention of the reflection light from being incident to the first optical detecting unit, and the high-quality optical detection of the first optical detecting unit.

According to still another aspect of the laser module relating to the present invention, the laser module with integrated wavelength monitor. Therefore, there is an effect that it is possible to realize the WDM having high reliability and high stability.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A wavelength monitor comprising:

an optical dividing unit that divides the laser beam into a first light and a second light;

a first optical detecting unit that detects the intensity of the first light;

an optical filtering unit that has a wavelength characteristic and has a light incident surface disposed at a predetermined angle from a surface perpendicular to the optical axis of the second light so as to transmit a part of the second light through the light incident surface and make the rest of the second light incident into the light incident surface; and a second optical detecting unit that detects the intensity of the light that has been transmitted through the optical filtering unit, wherein the predetermined angle is an angle that has been adjusted such that the other part of the second light that proceeds after being reflected from the light incident surface of the optical filtering unit and further reflected from the light emission surface of the optical dividing unit is not connected to the first optical detecting unit.

2. A wavelength monitor comprising:

an optical dividing unit that divides the laser beam into a first light and a second light;

a first optical detecting unit that detects the intensity of the first light;

an optical filtering unit that has a wavelength characteristic and has a light incident surface at an angle so as to transmit a part of the second light through the light incident surface and reflect the other portion of the second light from the light incident surface to an upper direction or a lower direction than the incident route of the second light; and a second optical detecting unit that detects the intensity of the light that has been transmitted through the optical filtering unit.

3. The wavelength monitor according to claim 2, wherein the optical filtering unit is constructed of an optical filter having a quadratic prism shape, and a supporting section that inclines the optical filter to the angle.

4. The wavelength monitor according to claim 2, wherein the optical detecting unit is a half-mirror.

5. The wavelength monitor according to claim 2, wherein the optical detecting unit is a prism.

6. A wavelength monitor comprising:

an optical dividing unit that has one or both of a light incident surface and a light emission surface at an angle to divide the laser beam into a first light and a second light, and transmit the laser beam to an upper direction or a lower direction than the incident route of the laser beam;

a first optical detecting unit that detects the intensity of the first light;

an optical filtering unit that has a wavelength characteristic, and that transmits a part of the second light and reflects the other portion of the second light; and a second optical detecting unit that detects the intensity of the light that has been transmitted through the optical filtering unit.

7. The wavelength monitor according to claim 6, wherein the optical detecting unit is a prism.

8. A wavelength monitor comprising:

a prism that divides the laser beam into a first light and a second light, and has an asymmetrical shape relative to an incident direction of the laser beam as a cross-sectional shape, or has a cross-sectional shape disposed to be asymmetrical relative to the incident direction of the laser beam;

a first optical detecting unit that detects the intensity of the first light;

an optical filtering unit that has a wavelength characteristic, and that transmits a part of the second light and reflects the other portion of the second light; and a second optical detecting unit that detects the intensity of the light that has been transmitted through the optical filtering unit.

9. The wavelength monitor according to claim 8, wherein the prism has its light emission surface disposed at a position that is deviated by a predetermined angle from a surface perpendicular to the incident direction of the laser beam.

10. The wavelength monitor according to claim 8, wherein there is provided a stage between a surface on which the prism is disposed and a surface on which at least the optical filter is disposed, and a surface of the stage that is in contact with the light emission surface is a side surface of the stage.

11. The wavelength monitor according to claim 8, further comprising a prism holder that fixes the prism, and has a projection on the top of the prism holder, wherein a position of the prism is adjusted by manipulating the projection.

12. A wavelength monitor comprising:

an optical dividing unit that divides the laser beam into a first light and a second light;

a first optical detecting unit that detects the intensity of the first light;

an optical filtering unit that transmits a part of the second light; and a second optical detecting unit that detects the intensity of the light that has been transmitted through the optical filtering unit, wherein the inclination of a light incident surface and/or a light emission surface of the optical dividing unit or the optical filtering unit relative to the laser beam has been selected to prevent a stray light from the optical filtering unit to the first optical detecting unit.

13. A laser module comprising:

a semiconductor laser device that outputs a laser beam; and a wavelength monitor constructed of an optical dividing unit that divides the laser beam into a first light and a second light, a first optical detecting unit that detects the intensity of the first light, an optical filtering unit that has a wavelength characteristic and has a light incident surface disposed at a predetermined angle from a surface perpendicular to the optical axis of the second light so as to transmit a part of the second light through the light incident surface and make the rest of the second light incident into the light incident surface, and a second optical detecting unit that detects the intensity of the light that has been transmitted through the optical filtering unit, wherein the predetermined angle is an angle that has been adjusted such that the other part of the second light that proceeds after being reflected from the light incident surface of the optical filtering unit and further reflected from the light emission surface of the optical dividing unit is not connected to the first optical detecting unit.

14. A laser module comprising:

a semiconductor laser device that outputs a laser beam; and a wavelength monitor constructed of an optical dividing unit that divides the laser beam into a first light and a second light, a first optical detecting unit that detects the intensity of the first light, an optical filtering unit that has a wavelength characteristic and has a light incident surface at an angle so as to transmit a part of the second light through the light incident surface and reflect the other portion of the second light from the light incident surface to an upper direction or a lower direction than the incident route of the second light, and a second optical detecting unit that detects the intensity of the light that has been transmitted through the optical filtering unit.

15. A laser module comprising:

a semiconductor laser device that outputs a laser beam; and a wavelength monitor constructed of an optical dividing unit that has a light incident surface and/or a light emission surface at an angle to divide the laser beam into a first light and a second light, and transmit the laser beam to an upper direction or a lower direction than the incident route of the laser beam; a first optical detecting unit that detects the intensity of the first light, an optical filtering unit that has a wavelength characteristic, and that transmits a part of the second light and reflects the other portion of the second light, and a second optical detecting unit that detects the intensity of the light that has been transmitted through the optical filtering unit.

16. A laser module comprising:

a semiconductor laser device that outputs a laser beam; and a wavelength monitor constructed of a prism that divides the laser beam into a first light and a second light, and has an asymmetrical shape relative to an incident direction of the laser beam as a cross-sectional shape, or has a cross-sectional shape disposed to be asymmetrical relative to the incident direction of the laser beam, a first optical detecting unit that detects the intensity of the first light, an optical filtering unit that has a wavelength characteristic, and that transmits a part of the second light and reflects the other portion of the second light, and a second optical detecting unit that detects the intensity of the light that has been transmitted through the optical filtering unit.

17. The laser module according to claim 16, wherein the prism has its light emission surface disposed at a position that is deviated by a predetermined angle from a surface perpendicular to the incident direction of the laser beam.

18. The laser module according to claim 16, wherein there is provided a stage between a surface on which the prism is disposed and a surface on which at least the optical filtering unit is disposed, and a surface of the stage that is in contact with the light emission surface is a side surface of the stage.

19. The laser module according to claim 16, further comprising a prism holder that fixes the prism, and has a projection on the top of the prism holder, wherein a position of the prism is adjusted by manipulating the projection.

20. A laser module comprising:

a semiconductor laser device that outputs a laser beam; and a wavelength monitor constructed of an optical dividing unit that divides the laser beam into a first light and a second light, a first optical detecting unit that detects the intensity of the first light, an optical filtering unit that transmits a part of the second light, and a second optical detecting unit that detects the intensity of the light that has been transmitted through the optical filtering unit, wherein the inclination of a light incident surface and/or a light emission surface of the optical dividing unit or the optical filtering unit relative to the laser beam has been selected to prevent a stray light from the optical filtering unit to the first optical detecting unit.

* * * * *